United States Patent
Shih et al.

(10) Patent No.: US 11,688,628 B2
(45) Date of Patent: Jun. 27, 2023

(54) METHOD OF MANUFACTURING EPITAXY SUBSTRATE

(71) Applicant: GlobalWafers Co., Ltd., Hsinchu (TW)

(72) Inventors: Ying-Ru Shih, Hsinchu (TW); Chih-Yuan Chuang, Hsinchu (TW); Chi-Tse Lee, Hsinchu (TW); Chun-I Fan, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 201 days.

(21) Appl. No.: 17/375,008

(22) Filed: Jul. 14, 2021

(65) Prior Publication Data

US 2021/0343583 A1    Nov. 4, 2021

Related U.S. Application Data

(62) Division of application No. 16/354,188, filed on Mar. 15, 2019, now Pat. No. 11,201,080.

(30) Foreign Application Priority Data

Apr. 3, 2018    (TW) .................................. 107111728

(51) Int. Cl.
*H01L 21/02*    (2006.01)
*H01L 21/762*    (2006.01)
(Continued)

(52) U.S. Cl.
CPC .......... *H01L 21/76251* (2013.01); *B32B 3/02* (2013.01); *B32B 18/00* (2013.01);
(Continued)

(58) Field of Classification Search
CPC ......... H01L 21/76251; H01L 21/02021; H01L 21/2007
See application file for complete search history.

(56) References Cited

U.S. PATENT DOCUMENTS

| | | | |
|---|---|---|---|
| 5,045,505 A | * | 9/1991 | Kimura .................... B24B 9/065 451/63 |
| 2011/0230003 A1 | * | 9/2011 | Vaufredaz ......... H01L 21/76256 438/459 |

(Continued)

FOREIGN PATENT DOCUMENTS

| | | | |
|---|---|---|---|
| CN | 102498547 | 6/2012 | |
| WO | WO-0110644 A1 * | 2/2001 | ........... B28D 5/0011 |
| WO | 2011125305 | 10/2011 | |

OTHER PUBLICATIONS

"Notice of allowance of China Counterpart Application", dated Aug. 31, 2022, p. 1-p. 4.

*Primary Examiner* — Michele Fan
(74) *Attorney, Agent, or Firm* — JCIPRNET

(57) ABSTRACT

A method of manufacturing an epitaxy substrate is provided. A handle substrate is provided. A beveling treatment is performed on an edge of a device substrate such that a bevel is formed at the edge of the device substrate, wherein a thickness of the device substrate is greater than 100 μm and less than 200 μm. An ion implantation process is performed on a first surface of the device substrate to form an implantation region within the first surface. A second surface of the device substrate is bonded to the handle substrate for forming the epitaxy substrate, wherein a bonding angle greater than 90° is provided between the bevel of the device substrate and the handle substrate, and a projection length of the bevel toward the handle substrate is between 600 μm and 800 μm.

15 Claims, 5 Drawing Sheets

(51) Int. Cl.
  *H01L 29/04*      (2006.01)
  *H01L 29/06*      (2006.01)
  *B32B 3/02*       (2006.01)
  *B32B 18/00*      (2006.01)
  *H01L 21/265*     (2006.01)

(52) U.S. Cl.
  CPC .. *H01L 21/02021* (2013.01); *H01L 21/26506* (2013.01); *H01L 29/04* (2013.01); *H01L 29/0603* (2013.01); *B32B 2250/02* (2013.01); *B32B 2307/20* (2013.01)

(56) References Cited

U.S. PATENT DOCUMENTS

| | | | |
|---|---|---|---|
| 2013/0273714 A1* | 10/2013 | Wei | H01L 21/76254 438/458 |
| 2014/0106649 A1 | 4/2014 | Kim et al. | |
| 2017/0316929 A1 | 11/2017 | Oefner et al. | |

* cited by examiner

METHOD OF MANUFACTURING EPITAXY SUBSTRATE

CROSS-REFERENCE TO RELATED APPLICATION

This application is a divisional application of and claims the priority benefit of U.S. patent application Ser. No. 16/354,188, filed on Mar. 15, 2019. The prior application Ser. No. 16/354,188 claims the priority benefit of Taiwan application serial no. 107111728, filed on Apr. 3, 2018. The entirety of each of the above-mentioned patent applications is hereby incorporated by reference herein and made a part of specification.

BACKGROUND

Technical Field

The disclosure relates to a substrate and a method of manufacturing the same, and more particularly to a method of manufacturing an epitaxy substrate.

Description of Related Art

Epitaxy refers to a technique of growing new crystals on a wafer to form a semiconductor layer. Since a film formed by an epitaxial process has advantages such as high purity, good thickness control and the like, epitaxy has been widely used in the manufacture of radio frequency (RF) devices or power devices.

Currently, silicon-on-insulator (SOI) wafers are used in epitaxial technology. However, due to high-speed rotation of the machine, a junction of an SOI wafer may easily collide with a carrier to cause problems of chipping and contamination, and defects may occur at a wafer edge. Such defects can affect subsequently formed devices and result in poor device quality.

In the epitaxial process, since the maximum stress tends to be applied to a substrate edge, both epitaxial cracks and slip lines of the substrate extend from the substrate edge toward the center of an epitaxial surface.

In addition, at an epitaxy-substrate interface, there is often a problem of interface loss of the epitaxy-substrate interface, resulting from spontaneous polarization induced by an epitaxial material itself, piezoelectric polarization induced by lattice mismatch between the epitaxy and the substrate, or diffusion of epitaxial layer atoms to the substrate.

Further, more seriously, if the stress between the epitaxy substrate and the epitaxial layer is too large, the substrate can crack.

In addition, if the required epitaxy substrate is an SOI substrate, a highly conductive charge inversion layer or accumulation layer is likely to form at an interface between a buried oxide (BOX) layer and the substrate, which may decrease the resistivity of the substrate and cause parasitic power loss.

In general, a high-resistivity substrate has a relatively poor bending strength and is therefore prone to breakage. Moreover, a subsequent high-temperature process may cause thermal donors to be formed on a substrate containing, for example, oxygen atoms, thus causing a decrease in the resistivity of the substrate. Therefore, in order to meet subsequent customer requirements, a "high-resistivity, high-strength and low-oxygen" wafer is to be designed.

SUMMARY

The disclosure provides a method of manufacturing an epitaxy substrate, the method being suitable for manufacturing an epitaxy substrate having high resistivity, high strength and low oxygen.

A method of manufacturing an epitaxy substrate of the disclosure includes the following. A handle substrate is provided. In addition, a beveling treatment is performed on an edge of a device substrate such that a bevel is formed at the edge of the device substrate, wherein a thickness of the device substrate is greater than 100 µm and less than 200 µm. An ion implantation process is performed on a first surface of the device substrate to form an implantation region within the first surface. A second surface of the device substrate is bonded to the handle substrate to form the epitaxy substrate, wherein a bonding angle greater than 90° is provided between the bevel of the device substrate and the handle substrate, and a projection length of the bevel toward the handle substrate is between 600 µm and 800 µm.

In one embodiment of the disclosure, a distance between the implantation region and the first surface is approximately 10 nm to 95 nm.

In one embodiment of the disclosure, a method of providing the handle substrate includes doping carbon, nitrogen or a combination thereof during crystal growth.

In one embodiment of the disclosure, after the handle substrate is provided, a protective layer is further formed on a surface of the handle substrate that is not bonded to the device substrate.

In one embodiment of the disclosure, in a method of bonding the second surface of the device substrate to the handle substrate, the bonding between the second surface of the device substrate and the handle substrate may further be performed through a bonding layer.

In one embodiment of the disclosure, before the second surface of the device substrate is bonded to the handle substrate, a charge trapping layer is further formed on a surface of the handle substrate that is bonded to the device substrate.

In one embodiment of the disclosure, the resistivity of the device substrate is greater than 100 ohm-cm.

In one embodiment of the disclosure, an error value of crystal orientation of the device substrate is less than ±0.05 degree.

In one embodiment of the disclosure, the bonding angle is 100° to 170°.

In one embodiment of the disclosure, the oxygen content of the device substrate is less than 5 ppma.

In one embodiment of the disclosure, a resistivity of the device substrate is greater than a resistivity of the handle substrate.

In one embodiment of the disclosure, after annealing at 450° C. for one hour, the resistivity of the device substrate is greater than the resistivity of the handle substrate.

In one embodiment of the disclosure, after a heat treatment at 720° C. for two minutes, the resistivity of the device substrate is greater than the resistivity of the handle substrate.

In one embodiment of the disclosure, a diameter of the handle substrate and a diameter of the second surface of the device substrate are different by 0.2 mm or more.

In one embodiment of the disclosure, a maximum deformation amount of the handle substrate is less than 6.5 mm.

Based on the above, in the method of the disclosure, due to the design of the bevel in the device substrate, the collision between the wafer junction and a carrier for carrying the epitaxy substrate can be prevented, and thus the problems of chipping and contamination can be avoided. Accordingly, the problem that defects are likely to occur at a wafer edge during wafer epitaxy can be solved. Moreover, in the disclosure, since the oxygen content of the device substrate is less than the oxygen content of the handle substrate, the resistivity of the device substrate can be greater than the resistivity of the handle substrate, and the handle substrate is a high-strength substrate. Thus, an epitaxy substrate having high resistivity, high strength and low oxygen can be realized. Further, if an implantation region is formed within the device substrate, the problem of interface loss at an epitaxial interface due to spontaneous or piezoelectric polarization or diffusion of epitaxial layer atoms to the substrate can be solved. By disposing the bonding layer between the device substrate and the handle substrate, devices can be insulated to reduce leakage current. By disposing the charge trapping layer between the bonding layer and the handle substrate, it can be prevented that the device substrate has a negative charge due to the bonding layer and thus decreases the resistivity of the substrate. In addition, by disposing the protective layer on a back surface of the handle substrate, the stress effect generated in the epitaxial process can be reduced and the epitaxy substrate can be prevented from cracking.

To make the aforementioned more comprehensible, several embodiments accompanied with drawings are described in detail as follows.

DESCRIPTION OF THE EMBODIMENTS

Figure 1:
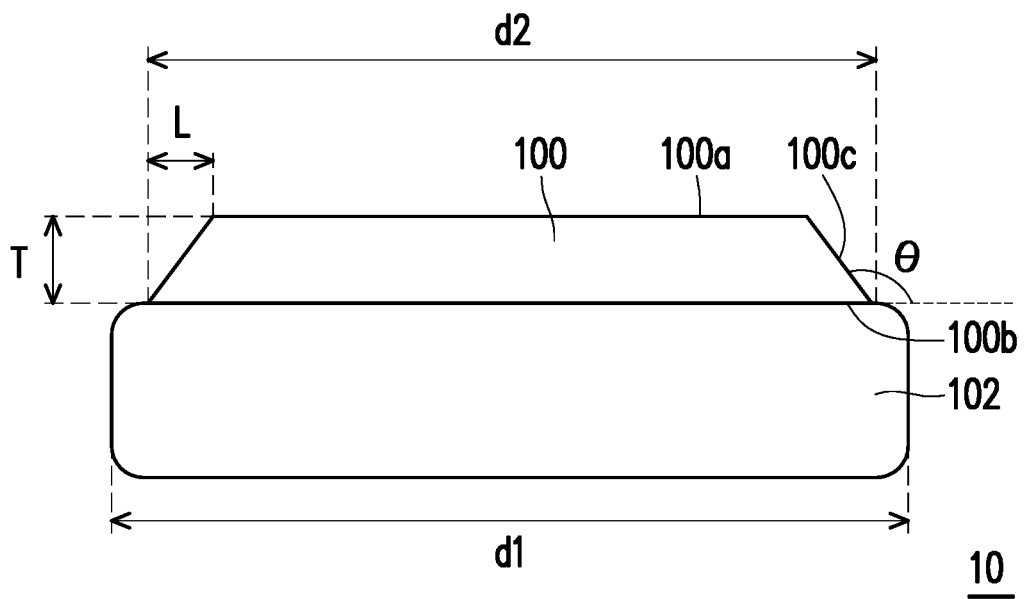
FIG. 1 is a schematic cross-sectional view of an epitaxy substrate according to a first embodiment of the disclosure.

Exemplary embodiments of the disclosure will be described comprehensively below with reference to the drawings, but the disclosure may be embodied in many different forms and should not be construed as being limited to the embodiments described herein. For clarity, in the drawings, sizes and thicknesses of regions, portions and layers are not illustrated in accordance with actual proportions. To facilitate understanding, the same components will hereinafter be denoted by the same reference numerals.

FIG. 1 is a schematic cross-sectional view of an epitaxy substrate according to a first embodiment of the disclosure.

Referring to FIG. 1, an epitaxy substrate 10 of the first embodiment includes a device substrate 100 and a handle substrate 102. The device substrate 100 has a first surface 100a and a second surface 100b opposite to each other, and a bevel 100c disposed between the first surface 100a and the second surface 100b. The handle substrate 102 is bonded to the second surface 100b of the device substrate 100, wherein an oxygen content of the device substrate 100 is less than an oxygen content of the handle substrate 102, a bonding angle θ greater than 90° is provided between the bevel 100c and the handle substrate 102, and the bonding angle θ is, for example, between 100° and 170°. In one embodiment, the oxygen content of the device substrate 100 is, for example, less than 5 ppma; in another embodiment, the oxygen content of the device substrate 100 is between 3 ppma and 4 ppma. In the first embodiment, due to the presence of the bevel 100c, chipping and contamination can be prevented from occurring at the wafer junction, namely a junction between the handle substrate 102 and the device substrate 100. Moreover, a problem that defects easily occur at a wafer edge during wafer epitaxy can be improved. A projection length L of the bevel 100c toward the handle substrate 102 is, for example, between 600 μm and 800 μm.

In addition, a diameter d1 of the handle substrate 102 and a diameter d2 of the second surface 102b of the device substrate 100 are, for example, different by 0.2 mm or more. In one embodiment, the diameter d1 of the handle substrate 102 and the diameter d2 of the second surface 102b of the device substrate 100 are different by 0.2 mm to 6 mm; that is, a difference in diameter on one side between the handle substrate 102 and the second surface 102b of the device substrate 100 is 0.1 mm to 3 mm. However, the disclosure is not limited thereto.

In FIG. 1, a resistivity of the device substrate 100 is greater than a resistivity of the handle substrate 102, and the resistivity of the device substrate 100 is, for example, greater than 100 ohm-cm. In another embodiment, the resistivity of the device substrate 100 is greater than 500 ohm-cm; in still another embodiment, the resistivity of the device substrate 100 is greater than 5000 ohm-cm. The resistivity of the handle substrate 102 is not particularly limited and may be, for example, within a range in which an RF device (1800 to 4000 ohm-cm) or a high electron mobility transistor (HEMT) device (<1 mohm-cm) can be applied.

A thickness T of the device substrate 100 may be between 100 μm and 200 μm, for example, greater than 100 μm and less than 200 μm. When the thickness T of the device substrate 100 is greater than 100 μm, since the device substrate 100 has sufficient thickness, the handle substrate 102 may be subsequently removed in the process according to customer requirements. The above device substrate 100 may preferably have a crystal orientation of (111) according to subsequent epitaxial requirements. However, the disclosure is not limited thereto. An error value of crystal orientation of the device substrate 100 is, for example, less than ±0.05 degree, preferably less than ±0.03 degree. When the error value of crystal orientation of the device substrate 100 is less than ±0.05 degree, epitaxial quality can be improved.

In the disclosure, the oxygen content of the device substrate 100 is less than the oxygen content of the handle substrate 102. The oxygen content of the device substrate 100 is, for example, less than 5 ppma, preferably between 3 ppma and 4 ppma. Alternatively, a silicon wafer formed by a floating zone (FZ) method and having a very low oxygen content may be used. The oxygen content of the handle substrate 102 located below is not particularly limited. In this way, a decrease in the resistivity of the device substrate 100 caused by thermal donors formed from a reaction between oxygen atoms and silicon atoms after a heat treatment can be prevented. Therefore, in one embodiment, after annealing at 450° C. for one hour, the resistivity of the device substrate 100 is still greater than the resistivity of the handle substrate 102; in another embodiment, after a heat treatment at 720° C. for two minutes, the resistivity of the device substrate 100 is still greater than the resistivity of the handle substrate 102.

According to the present embodiment, a material of the device substrate 100 and the handle substrate 102 is, for example, silicon, silicon carbide, aluminum oxide (sapphire), gallium nitride, aluminum nitride or other material. In addition, the materials of the device substrate 100 and the handle substrate 102 of the present embodiment may be homogeneous or heterogeneous. If the material of the handle substrate 102 is silicon, the crystal orientation thereof is not particularly limited and may be (100), (110), (111) or the like.

Figure 2:
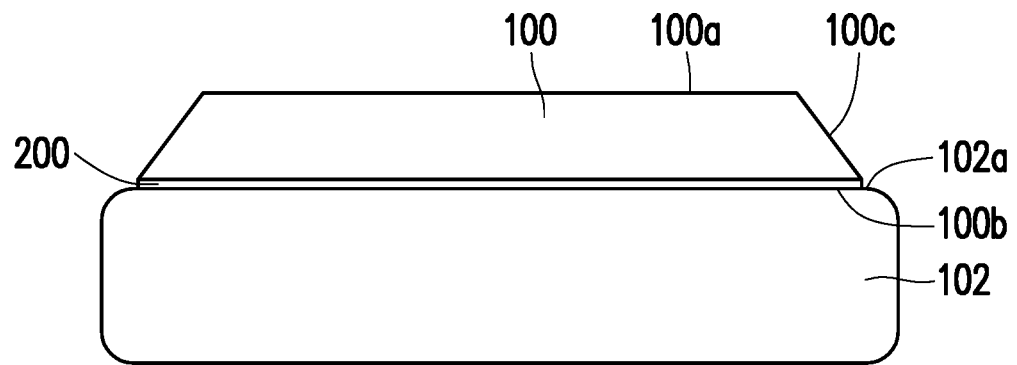
FIG. 2 is a schematic cross-sectional view of an epitaxy substrate according to a second embodiment of the disclosure.

FIG. 2 is a schematic cross-sectional view of an epitaxy substrate according to a second embodiment of the disclosure, wherein the same or similar reference numerals to those of the first embodiment are used to denote the same or similar components, and the description of the same technical content is omitted.

Referring to FIG. 2, an epitaxy substrate 20 of the second embodiment differs from the epitaxy substrate of the first embodiment in that a bonding layer 200 is further disposed between the handle substrate 102 and the device substrate 100, wherein the bonding layer 200 insulates devices to reduce leakage current. A material of the bonding layer 200 is, for example, silicon, silicon dioxide ($SiO_2$), silicon nitride ($Si_3N_4$) or aluminum nitride (AlN).

Figure 3:
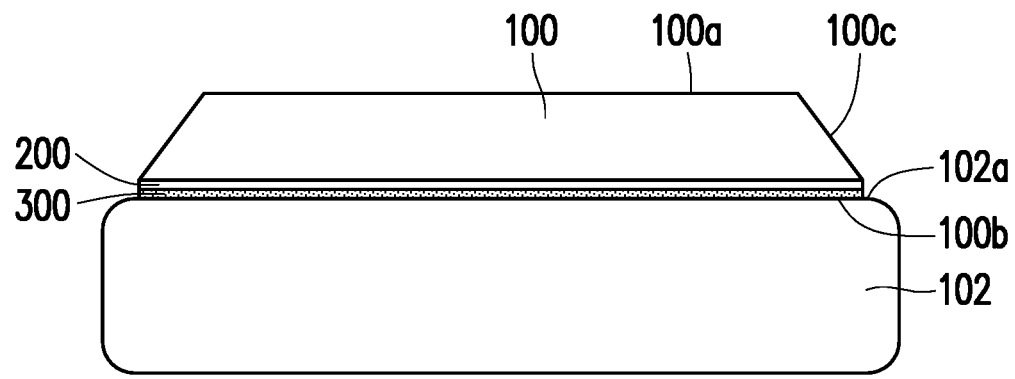
FIG. 3 is a schematic cross-sectional view of an epitaxy substrate according to a third embodiment of the disclosure.

Referring to FIG. 3, an epitaxy substrate 30 of the third embodiment differs from the epitaxy substrate of the second embodiment in that a charge trapping layer 300 is further disposed between the handle substrate 102 and the bonding layer 200. The bonding layer 200 may form a highly conductive charge inversion layer or accumulation layer on an interface between the bonding layer 200 and the handle substrate 102 to decrease the resistivity of the device substrate 100, and the above problem can be avoided by the presence of the charge trapping layer 300.

In some embodiments, the charge trapping layer 300 is a low electron affinity layer. The so-called "low electron affinity" means having lower electron affinity than that of the handle substrate 102. Hence, the low electron affinity layer is capable of suppressing formation of an N-type inversion layer. A material of the low electron affinity layer has, for example, a polycrystalline structure, an amorphous structure, a nanocrystalline structure or a single-crystal structure, and may be selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, group IIIA nitrides and metal oxides, wherein x, y and z are molar ratios having a value between 0 and 1. Examples of the above group IIIA nitrides include GaN, AlN, InN, BN or $Al_{1-x-y-z}Ge_xIn_yB_zN$; examples of the above metal oxides include $SnO_2$, $TiO_2$ or ZnO. In one embodiment, the charge trapping layer 300 is made of a polysilicon layer, and may be disposed as a highly defective layer between the handle substrate 102 and the bonding layer 200. This highly defective layer may be replaced with a surface damage layer formed by implanting heavy ions into a surface 102a of the handle substrate 102. However, the disclosure is not limited thereto.

Figure 4:
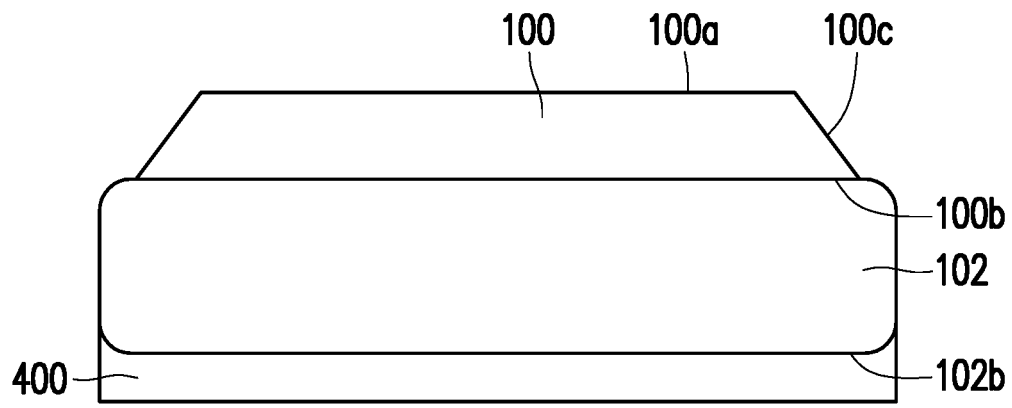
FIG. 4 is a schematic cross-sectional view of an epitaxy substrate according to a fourth embodiment of the disclosure.

Referring to FIG. 4, an epitaxy substrate 40 of the fourth embodiment differs from the epitaxy substrate of the first embodiment in that a protective layer 400 is disposed on a surface (e.g., a back surface 102b) of the handle substrate 102 that is not bonded to the device substrate 100. Due to the presence of the protective layer 400, the stress effect generated in the subsequent epitaxial process can be reduced and the epitaxy substrate 40 can be prevented from cracking. Therefore, in addition to FIG. 4, the protective layer 400 may also be applied to the epitaxy substrate of FIG. 2 or FIG. 3. A material of the protective layer 400 is, for example, $SiO_2$, metal silicides, polysilicon or $Si_3N_4$. The above metal silicides may be transition metal silicides, and examples thereof include nickel silicide, $NiSi_2$, $Ni_2Si$, tungsten silicide, titanium silicide, tantalum silicide or molybdenum silicide. The protective layer 400 reduces the stress effect between the epitaxy substrate 40 and the epitaxial layer, thus preventing the substrate from cracking. In addition, since the polysilicon material or metal silicide material has a good thermomechanical effect, it provides better protection.

Figure 5:
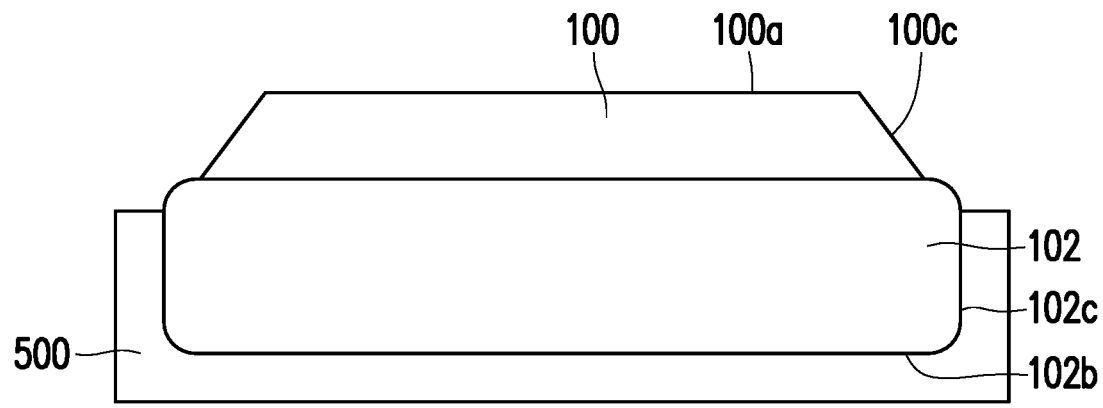
FIG. 5 is a schematic cross-sectional view of an epitaxy substrate according to a fifth embodiment of the disclosure.

Referring to FIG. 5, an epitaxy substrate 50 of the fifth embodiment differs from the epitaxy substrate of the first embodiment in that a protective layer 500 is disposed on a surface (including a side surface 102c and the back surface 102b) of the handle substrate 102 that is not bonded to the device substrate 100. A material of the protective layer 500 is the same as that of the protective layer in the fourth embodiment, and therefore will not be described again. Since the protective layer 500 extends to the side surface 102c of the handle substrate 102, even if the handle substrate 102 is a doped substrate, cracking of the epitaxy substrate 50 and autodoping to the device substrate 100 can both be prevented. Therefore, in addition to FIG. 5, the protective layer 500 may also be applied to the epitaxy substrate of any of FIG. 1 to FIG. 3.

Figure 6:
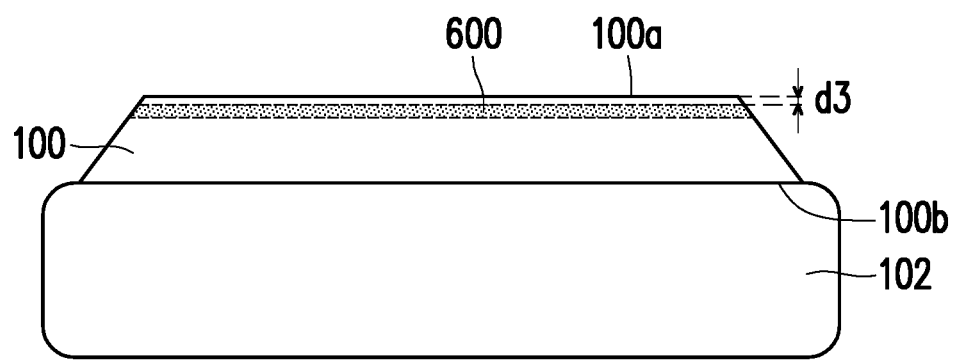
FIG. 6 is a schematic cross-sectional view of an epitaxy substrate according to a sixth embodiment of the disclosure.

Referring to FIG. 6, an epitaxy substrate 60 of the sixth embodiment differs from the epitaxy substrate of the first embodiment in that the epitaxy substrate 60 may further include an implantation region 600 located within the first surface 100a of the device substrate 100. In the present embodiment, a distance d3 between the implantation region 600 and the first surface 100a is approximately 10 nm to 95 nm, and is, for example, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm or 95 nm. Due to the presence of the implantation region 600, defects can be formed to capture electrons, thereby solving the problem of interface loss at an epitaxial interface (i.e., the first surface 100a of the device substrate 100) due to spontaneous or piezoelectric polarization. Therefore, in addition to FIG. 6, the implantation region 600 may also be applied to the epitaxy substrate of any of FIG. 2 to FIG. 5.

Figure 7:
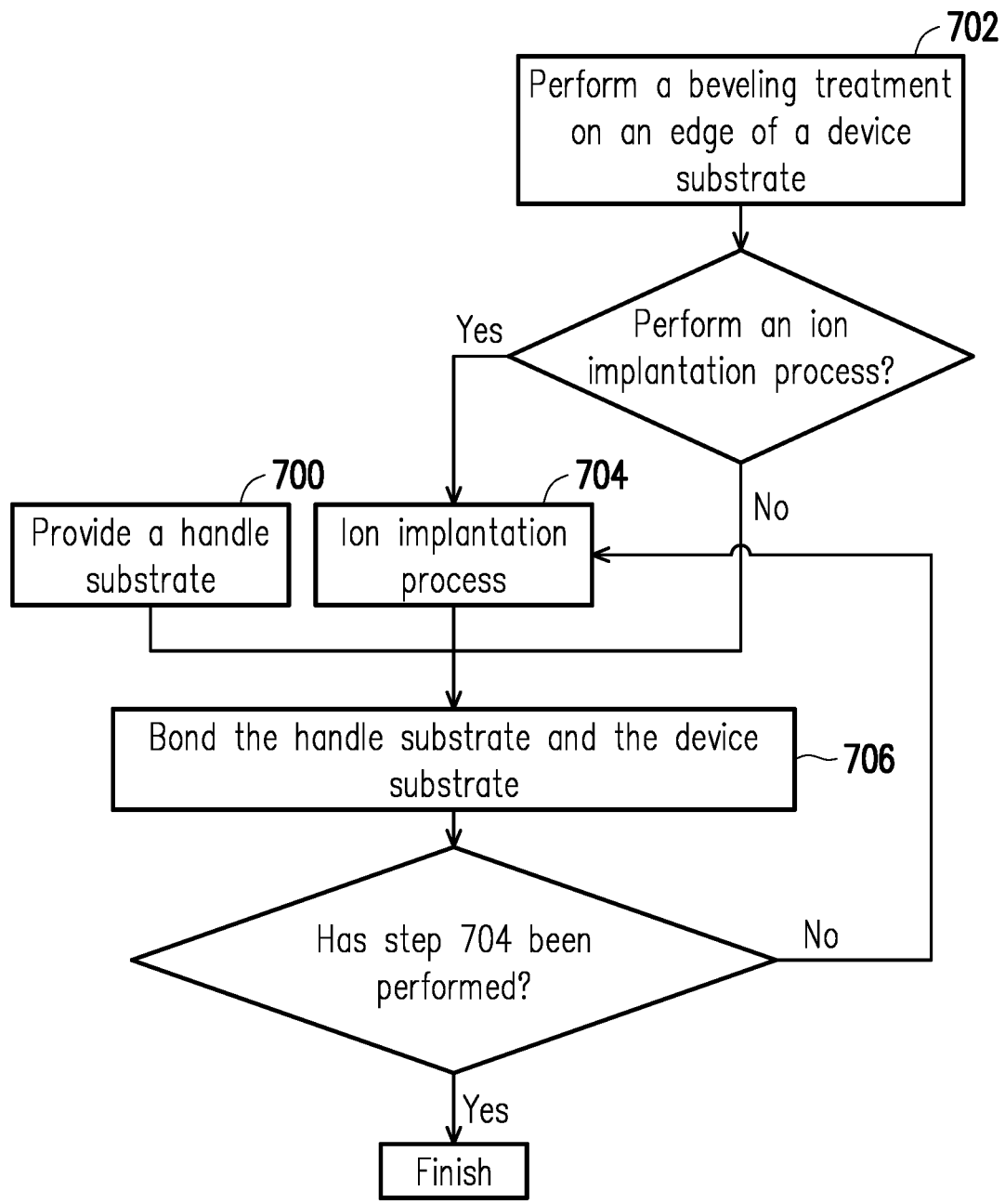
FIG. 7 is a process flow diagram of a process for manufacturing an epitaxy substrate according to a seventh embodiment of the disclosure.

FIG. 7 is a process flow diagram of a process for manufacturing an epitaxy substrate according to a seventh embodiment of the disclosure.

Referring to FIG. 7, since a handle substrate and a device substrate are processed separately, the order of steps 700, 702, and 704 does not matter. That is, in one embodiment, step 700 may be performed first, then steps 702 to 704 are performed, and finally step 706 is performed; in another embodiment, steps 702 to 704 are performed first, and then step 700 is performed, and finally step 706 is performed. In still another embodiment, step 700 may be performed first, then steps 702 and 706 are performed, and finally step 704 is performed; in yet still another embodiment, step 702 may be performed first, then steps 700 and 706 are performed, and finally step 704 is performed.

In step 700, a handle substrate is provided, wherein a material of the handle substrate is, for example, silicon, silicon carbide, aluminum oxide (sapphire), gallium nitride, aluminum nitride or other material. In one embodiment, the handle substrate is, for example, a silicon substrate formed using a Czochralski (CZ) method or a magnetic field applied Czochralski (MCZ) method. However, the disclosure is not limited thereto. In another embodiment, the handle substrate can be strengthened by doping carbon, nitrogen or a combination thereof during crystal growth. In detail, by doping carbon, nitrogen or a combination thereof during crystal growth, precipitation of precipitates such as $SiO_2$ can be facilitated after thermal annealing (rapid thermal annealing (RTA) or rapid thermal processing (RTP)), thereby forming bulk micro defects (BMD) to strengthen the handle substrate. However, if the handle substrate has sufficient oxygen content (e.g., greater than 14 ppma), the doping of carbon, nitrogen or a combination thereof during crystal growth is not required.

In another embodiment, after step 700, a protective layer may further be formed on a surface of the handle substrate that is not bonded to a device substrate. The protective layer is conducive to reducing the stress effect generated in the subsequent epitaxial process, thereby preventing an epitaxy substrate from cracking. A method of forming the protective layer is, for example, chemical vapor deposition (CVD), electrochemical deposition, vapor-liquid-solid deposition, vapor transport deposition, sol-gel, atomic layer deposition (ALD) or plasma-enhanced ALD. In terms of quality of the protective layer, atomic layer deposition (ALD) is preferred. Since the protective layer may extend from a bottom surface to a side surface of the handle substrate, even if the handle substrate is a doped substrate, cracking of the epitaxy substrate and autodoping to the device substrate can both be prevented. The details of the protective layer can be understood by referring to the descriptions of the fourth and fifth embodiments and are thus omitted.

Figure 8A:
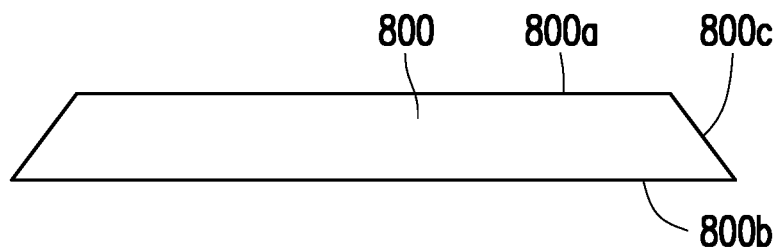
FIG. 8A is a schematic cross-sectional view of a type of device substrate after a beveling treatment in the seventh embodiment.
Figure 8B:
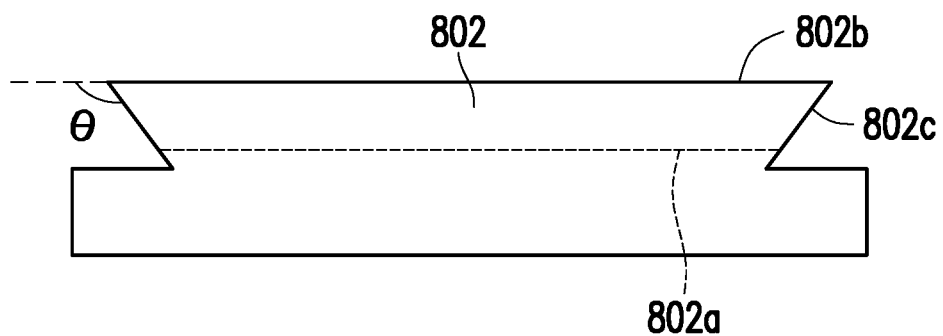
FIG. 8B is a schematic cross-sectional view of another type of device substrate after the beveling treatment in the seventh embodiment.

In step 702, a beveling treatment is performed on an edge of the device substrate such that a bevel is formed at the edge of the device substrate. A thickness of the device substrate is greater than 100 μm and less than 200 μm. The above beveling treatment is, for example, laser processing, grinding by a grinding wheel, or computer numerical control (CNC) processing. Moreover, the device substrate after the beveling treatment is as shown in FIG. 8A or FIG. 8B, wherein a device substrate 800 of FIG. 8A has a bevel 800c, and a second surface 800b of the device substrate 800 opposite to a first surface 800a is the surface bonded to the handle substrate. A device substrate 802 of FIG. 8B is processed using, for example, a T-shaped 45 degree round edge grinding wheel, and an angle between a bevel 802c and an intended first surface 802a of the device substrate 802 is equal to the bonding angle θ between a second surface 802b of the subsequent device substrate and the handle substrate. If the device substrate after step 702 (beveling treatment) is the device substrate 802 of FIG. 8B, after subsequent step 706, a step of thinning the device substrate 802 should be added to remove the portion below the first surface 802a (dashed line). In the present embodiment, a material of the device substrate is, for example, silicon, silicon carbide, aluminum oxide (sapphire), gallium nitride, aluminum nitride or other material. In addition, the materials of the device substrate and the handle substrate may be homogeneous or heterogeneous. In one embodiment, the device substrate is, for example, a silicon substrate formed using the FZ method; the handle substrate is, for example, a silicon substrate formed using the CZ method or the MCZ method.

Compared to the silicon substrate formed using the CZ method or the MCZ method, the silicon substrate formed using the FZ method may have a very low oxygen content. Thereby, the oxygen content of the device substrate is less than the oxygen content of the handle substrate. However, the disclosure is not limited thereto.

Then, according to actual process requirements, an ion implantation process (step 704) may be performed first, or the device substrate and the handle substrate are bonded prior to the ion implantation process (step 704).

In step 704, the ion implantation process is performed on a first surface of the device substrate to form an implantation region within the first surface. The ion implantation process is, for example, implanting a group IV element or an inert gas. In the present embodiment, a distance between the implantation region and the first surface is, for example, approximately 10 nm to 95 nm. Moreover, after the implantation region is formed, an annealing process may further be performed on the device substrate to repair the first surface of the device substrate. Since defects can be formed by the implantation region to capture electrons, the problem of interface loss at the epitaxial interface due to spontaneous or piezoelectric polarization or diffusion of epitaxial layer atoms to the substrate can be solved. The details of the implantation region can be understood by referring to the description of the sixth embodiment and are thus omitted.

In step 706, a second surface of the device substrate is bonded to the handle substrate to form the epitaxy substrate, wherein a bonding angle greater than 90°, for example, between 100° and 170°, is provided between the bevel of the device substrate and the handle substrate. A projection length of the bevel toward the handle substrate is between 600 μm and 800 μm. A bonding method includes pre-bonding and annealing. However, the disclosure is not limited thereto. In one embodiment, in the method of bonding the handle substrate and the device substrate, the bonding between the second surface of the device substrate and the handle substrate may further be performed through a bonding layer. The bonding layer is capable of insulating devices to reduce leakage current. The details of the bonding layer can be understood by referring to the description of the second embodiment and are thus omitted. In addition, since the bonding layer may have a positive charge, a highly conductive charge inversion layer or accumulation layer may be formed at an interface between the bonding layer and the handle substrate, thus decreasing resistivity of the epitaxy substrate and causing parasitic power loss. Therefore, in the case where the bonding layer is provided, a charge trapping layer may be formed on a surface of the handle substrate that is to be bonded to the device substrate before the bonding of the handle substrate and the device substrate. The charge trapping layer can be understood by referring to the description of the third embodiment and an explanation thereof is thus omitted.

In addition, if step 704 has not been performed, step 704 needs to be performed after step 706, so to form the implantation region within the first surface of the device substrate.

Experimental examples are provided below to prove that the handle substrate of the present embodiment is a high-strength handle substrate.

Experimental Group

A silicon wafer having a resistivity of 2.5 to 4.5 mohm-cm and a thickness of 725±5 μm was cut into a 2±0.1 cm×6±0.1 cm test piece, and the test piece was placed in the middle of two sapphire columns of 8 mm×8 mm×100 mm in length, width and height. A weight block was further placed on top of the test piece, and a total weight was 500±1 g. After a high-temperature heat treatment at 1100±5° C. for four hours, a "maximum wafer deformation amount" was measured three times using a dial indicator, and an average value of 6.45 mm was obtained.

<Control Group 1>

The same experimental parameters as those of the experimental group were used except that a silicon wafer having a resistivity of 1 to 15 ohm-cm was used instead. The "maximum wafer deformation amount" was measured three times, and an average value of 6.84 mm was obtained.

<Control Group 2>

The same experimental parameters as those of the experimental group were used except that a silicon wafer having a resistivity of 4000 to 6000 ohm-cm was used instead. The "maximum wafer deformation amount" was measured three times, and an average value of 8.10 mm was obtained.

As is clear from the above experimental results, the smaller the resistivity of the handle substrate, the smaller the maximum deformation amount of the handle substrate, and the higher the strength of the handle substrate. It is known from the above experimental group that the maximum deformation amount of the handle substrate of the disclosure is, for example, less than 6.5 mm, preferably 6.45 mm or less.

In summary, in the epitaxy substrate of the disclosure, the device substrate has a bevel, and due to the angle between the bevel and the handle substrate, chipping and contamination can be prevented from occurring at the junction between the device substrate and the handle substrate, and the problem that defects easily occur at a wafer edge during wafer epitaxy can be solved. Moreover, in the disclosure, the oxygen content of the device substrate is less than the oxygen content of the handle substrate, and the oxygen content of the device substrate is small enough (e.g., less than 5 ppma) to prevent the formation of thermal donors and thus to prevent a decrease in the resistivity of the device substrate. In addition, the resistivity of the device substrate is large enough (e.g., greater than 100 ohm-cm) to achieve high resistivity characteristics, which can be applied to RF devices. In addition, by doping during crystal growth, the handle substrate can be strengthened; or, when the oxygen content of the handle substrate is large enough (e.g., greater than 14 ppma), sufficient strength can be provided, thereby realizing an epitaxy substrate having high resistivity, high strength and low oxygen. In addition, by the implantation region located within the device substrate, the problem of interface loss at the epitaxial interface due to spontaneous or piezoelectric polarization or diffusion of epitaxial layer atoms to the substrate can be solved. By the bonding layer provided between the device substrate and the handle substrate, leak current can be reduced. In order to prevent formation of a highly conductive charge inversion layer at the interface between the bonding layer and the handle substrate, in the disclosure, the charge trapping layer may be disposed between the bonding layer and the handle substrate. In addition, by disposing the protective layer on the back surface or side surface of the handle substrate, the stress effect generated in the epitaxial process can be reduced and the epitaxy substrate can be prevented from cracking.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing an epitaxy substrate, the method comprising:
   providing a handle substrate;
   performing a beveling treatment on an edge of a device substrate such that a bevel is formed at the edge of the device substrate, wherein a thickness of the device substrate is greater than 100 μm and less than 200 μm;
   performing an ion implantation process on a first surface of the device substrate to form an implantation region within the first surface; and
   bonding a second surface of the device substrate to the handle substrate to form the epitaxy substrate, wherein a bonding angle greater than 90° is provided between the bevel of the device substrate and the handle substrate, and a projection length of the bevel toward the handle substrate is between 600 μm and 800 μm.

2. The method of manufacturing an epitaxy substrate of claim 1, wherein a distance between the implantation region and the first surface is 10 nm to 95 nm.

3. The method of manufacturing an epitaxy substrate of claim 1, wherein a method of providing the handle substrate comprises doping carbon, nitrogen or a combination thereof during crystal growth.

4. The method of manufacturing an epitaxy substrate of claim 1, further comprising, after providing the handle substrate, forming a protective layer on a surface of the handle substrate that is not bonded to the device substrate.

5. The method of manufacturing an epitaxy substrate of claim 1, wherein a method of bonding the second surface of the device substrate to the handle substrate further comprises performing the bonding between the second surface of the device substrate and the handle substrate through a bonding layer.

6. The method of manufacturing an epitaxy substrate of claim 5, further comprising, before bonding the second surface of the device substrate to the handle substrate, forming a charge trapping layer on a surface of the handle substrate that is bonded to the device substrate.

7. The method of manufacturing an epitaxy substrate of claim 1, wherein a resistivity of the device substrate is greater than 100 ohm-cm.

8. The method of manufacturing an epitaxy substrate of claim 1, wherein an error value of crystal orientation of the device substrate is less than ±0.05 degree.

9. The method of manufacturing an epitaxy substrate of claim 1, wherein the bonding angle is 100° to 170°.

10. The method of manufacturing an epitaxy substrate of claim 1, wherein the oxygen content of the device substrate is less than 5 ppma.

11. The method of manufacturing an epitaxy substrate of claim 1, wherein a resistivity of the device substrate is greater than a resistivity of the handle substrate.

12. The method of manufacturing an epitaxy substrate of claim 11, wherein after annealing at 450° C. for one hour, the resistivity of the device substrate is greater than the resistivity of the handle substrate.

13. The method of manufacturing an epitaxy substrate of claim 11, wherein after a heat treatment at 720° C. for two minutes, the resistivity of the device substrate is greater than the resistivity of the handle substrate.

14. The method of manufacturing an epitaxy substrate of claim 1, wherein a diameter of the handle substrate and a diameter of the second surface of the device substrate are different by 0.2 mm or more.

15. The method of manufacturing an epitaxy substrate of claim 1, wherein a maximum deformation amount of the handle substrate is less than 6.5 mm.

* * * * *